United States Patent
Murakami et al.

(10) Patent No.: US 7,692,464 B2
(45) Date of Patent: Apr. 6, 2010

(54) PULSE WIDTH MODULATION WAVE OUTPUT CIRCUIT

(75) Inventors: Shintaroh Murakami, Yokohama (JP); Kanji Egawa, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 12/050,172

(22) Filed: Mar. 18, 2008

(65) Prior Publication Data

US 2008/0246523 A1 Oct. 9, 2008

(30) Foreign Application Priority Data

Apr. 3, 2007 (JP) ............................. 2007-97406

(51) Int. Cl.
*H03K 3/017* (2006.01)
(52) U.S. Cl. ..................... 327/175; 327/77; 327/172
(58) Field of Classification Search .............. 327/131, 327/133–135, 172–175, 77
See application file for complete search history.

(56) References Cited

U.S. PATENT DOCUMENTS

| | | | |
|---|---|---|---|
| 5,675,697 A * | 10/1997 | Lee | ............................. 386/124 |
| 5,812,831 A | 9/1998 | Crocker | |
| 6,023,199 A | 2/2000 | Cheung | |
| 6,998,928 B2 | 2/2006 | Stengel et al. | |
| 7,142,597 B2 | 11/2006 | Midya et al. | |
| 7,262,589 B2 | 8/2007 | Chen | |
| 7,268,639 B2 | 9/2007 | Matsushita | |
| 7,301,417 B2 | 11/2007 | Shinohara | |
| 7,315,158 B1 | 1/2008 | Matsui | |
| 7,315,202 B2 | 1/2008 | Tsuji | |
| 7,323,919 B2 | 1/2008 | Yang et al. | |
| 7,388,426 B2 * | 6/2008 | Chang et al. | .................... 330/10 |
| 7,453,246 B2 * | 11/2008 | Qiu et al. | ..................... 323/282 |
| 7,471,133 B1 * | 12/2008 | Moussaoui et al. | ........... 327/172 |

FOREIGN PATENT DOCUMENTS

| | | |
|---|---|---|
| JP | 5068372 A | 3/1993 |
| JP | 2006174626 A | 6/2006 |

* cited by examiner

*Primary Examiner*—Long Nguyen
*Assistant Examiner*—Sibin Chen
(74) *Attorney, Agent, or Firm*—Charles Bergere

(57) ABSTRACT

A pulse width modulation (PWM) wave output circuit that efficiently and accurately outputs dual PWM waves includes two comparators, an OR circuit, and an AND circuit. A voltage generator supplies the comparators with ramp voltages having the same wave height and shifted phases. The comparator compares the ramp voltages with the reference voltage and provides the comparison results to the OR circuit and the AND circuit. The OR circuit outputs a first modulation wave, and the AND circuit generates a second modulation wave. Accordingly, modulation waves having different duties are output based on ramp voltage having different phases.

2 Claims, 4 Drawing Sheets

PULSE WIDTH MODULATION WAVE OUTPUT CIRCUIT

BACKGROUND OF THE INVENTION

The present invention relates to a pulse width modulation wave output circuit that uses a ramp voltage to output a pulse width modulation signal.

A power supply device that supplies stable direct current (DC) voltage, which is generated from alternating current (AC) voltage, normally includes a linear regulator or a switching regulator (for example, refer to Japanese Laid-Open Patent Publication No. 5-68372, page 1 and Japanese Laid-Open Patent Publication No. 2006-17462, page 1). A switching regulator is smaller and more efficient that a linear regulator. The switching regulator is one type of a DC stabilizing power supply that is controlled in a switching mode. The switching regulator activates and deactivates a semiconductor switch, such as a power MOSFET, to switch the input power and control the output voltage. The ratio of the ON time and OFF time (duty ratio) of the semiconductor switch is varied to control the output voltage.

In the switching regulator described in Japanese Laid-Open Patent Publication No. 5-68372, to reduce fluctuations of the voltage caused by changes in the input voltage, an input voltage differentiation circuit and a level shift circuit are added to a control circuit of the switching regulator to shift the level of a sawtooth wave in the control circuit in accordance with changes in the input voltage.

In the switching regulator described in Japanese Laid-Open Patent Publication No. 2006-17462, to enable switching operations to be efficiently performed, the output of a triangular wave generation circuit is switched based on a potential at a subsequent stage of an inductor, which smoothes an output potential.

Further, referring to FIGS. 7 to 9, a dual pulse width modulation (PWM) wave output circuit 10, which uses two ramp voltages having the same wave height to output two PWM waves, has been proposed. As shown in FIG. 7, the dual PWM wave output circuit 10 includes two comparators 11 and 12. The comparator 11 receives a reference voltage Vc and a ramp voltage RMP11 from a voltage generator SG1 to output a modulation wave PWM1. The comparator 12 receives the reference voltage Vc and a ramp voltage RMP12 from the voltage generator SG1 to output a modulation wave PWM2.

Referring to FIG. 8A, the ramp voltages RMP11 and RMP12 of the voltage generator SG1 are voltages having sawtooth waveforms. The ramp voltage RMP12 is generated by shifting the minimum voltage level of the ramp voltage RMP11. As a result, as shown in FIG. 8B, the dual PWM wave output circuit 10 outputs the modulation waves PWM1 and PWM2. The overlapping range of the ramp voltages RMP11 and RMP12 may be controlled to control the pulse width of the modulation waves PWM11 and PWM12 with respect to the reference voltage Vc. Further, referring to FIG. 9, the ON/OFF duty ratio of the modulation waves PWM1 and PWM2 may be controlled relative to the reference voltage Vc.

However, Japanese Laid-Open Patent Publication Nos. 5-68372 and 2006-17462 do not consider a buck boosting type structure for overlapped ramp voltage waveforms. When the minimum voltage level of one of the ramp voltages is simply shifted to generate the other ramp voltage, it would be difficult to obtain sufficient amplitude for a low power supply voltage application. Additionally, variations in the ramp voltage wave heights are independent from variations in the voltage shift amount. Thus, variations in the maximum value of the ramp voltage are increased. This limits the dynamic range when the voltage is lowered. Further, the voltage variations increase variations in the overlapped amount. As a result, a PWM wave cannot be accurately output.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The present invention provides a pulse width modulation wave output circuit that efficiently outputs accurate dual pulse width modulation waves.

One aspect of the present invention is a pulse width modulation wave output circuit including a first voltage comparison means for inputting a first ramp voltage. A second voltage comparison means inputs a second ramp voltage having a phase shifted from that of the first ramp voltage. The first and second voltage comparison means acquire a reference voltage and perform comparison with the reference signal to output comparison signals used to generate pulse width modulation signals having different ON/OFF duties.

Other aspects and advantages of the present invention will become apparent from the following description, taken in conjunction with the accompanying drawings, illustrating by way of example the principles of the invention.

Figure 1:
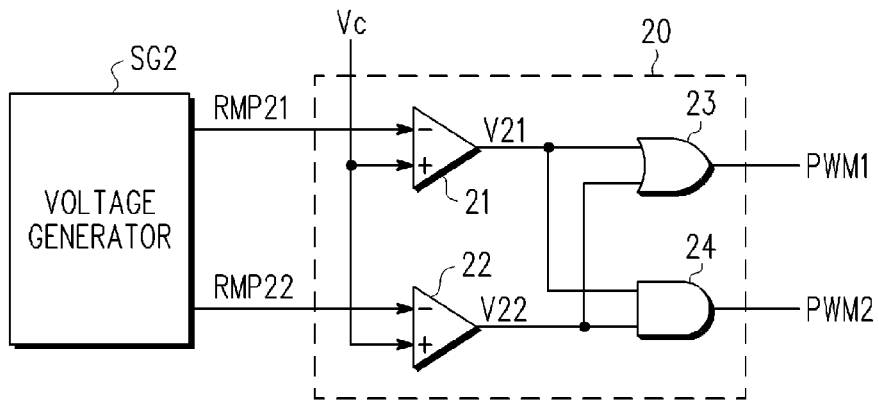
FIG. 1 is a circuit diagram of a pulse width modulation wave output circuit according to a first embodiment of the present invention.

A pulse width modulation wave output circuit according to a first embodiment of the present invention will now be described with reference to FIGS. 1 and 2. Referring to FIG. 1, a dual PWM wave output circuit 20, which serves as the pulse width modulation wave output circuit of this embodiment, includes two comparators 21 and 22, an OR circuit 23 serving as an OR operation means, and an AND circuit 24 serving as an AND operation means. The comparator 21 serves as a first voltage comparison means, and the comparator 22 serves as a second voltage comparison means.

The comparator 21 includes a negative input terminal, which receives a ramp voltage RMP21 (first ramp voltage) from a voltage generator SG2, a positive input terminal, which receives a reference voltage Vc, and an output terminal, which outputs voltage V21. The comparator 22 includes a negative input terminal, which receives a ramp voltage RMP22 (second ramp voltage) from the voltage generator SG2, a positive input terminal, which receives the reference voltage Vc, and an output terminal, which outputs voltage V22.

The voltages V21 and V22 are input to the OR circuit 23 and the AND circuit 24. Then, the OR circuit 23 outputs a modulation wave PWM1, and the AND circuit 24 outputs a modulation wave PWM2.

Figure 2A:
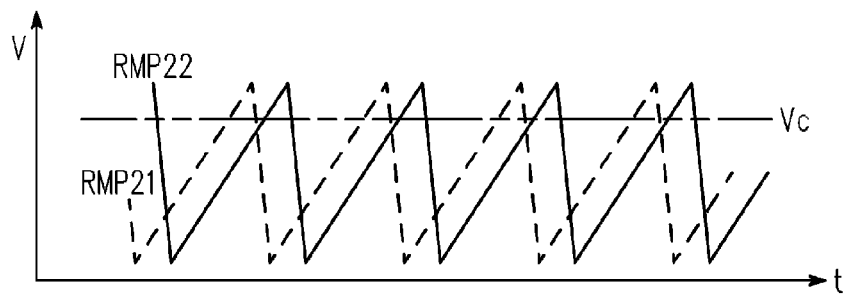
FIG. 2A is a timing chart of input ramp voltages.

FIG. 2A shows the waveforms of the ramp voltages RMP21 and RMP22 generated by the voltage generator SG2 and respectively input to the comparators 21 and 22. As shown in FIG. 2A, the ramp voltages RMP21 and RMP22 of the voltage generator SG2 have sawtooth waveforms. The ramp voltage RMP22 is generated by shifting the ramp voltage RMP21 along a time axis while maintaining the same wave height. In other words, the ramp voltage RMP22 is generated by shifting the phase of the ramp voltage RMP21. In this case, the shift amount of the ramp voltages RMP1 and RMP2 is controlled so that the voltages V21 and V22 include overlapping ranges.

Figure 2B:
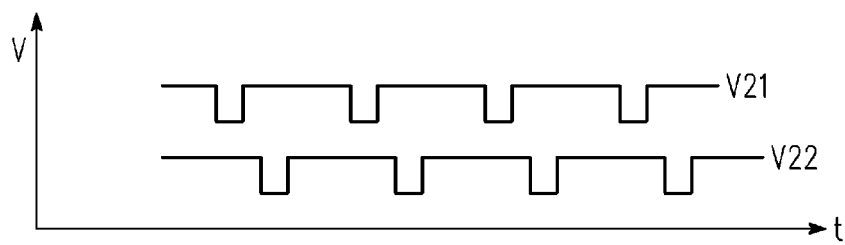
FIG. 2B is a timing chart of voltages output from comparators.
Figure 2C:
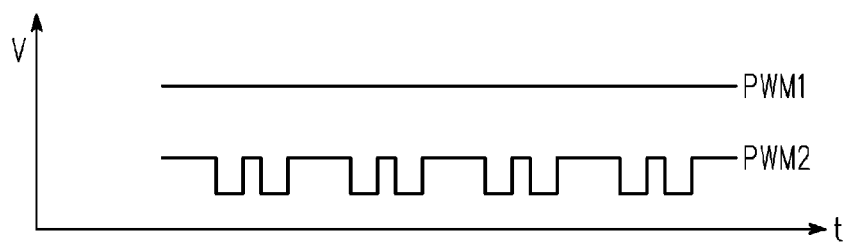
FIG. 2C is a timing chart of output PWM waves.

As shown in FIG. 2B, the voltages V21 and V22, which are output from the comparators 21 and 22, have rectangular waves with shifted phases. The voltages V21 and V22 undergo AND and OR operations. As a result, as shown in FIG. 2C, the dual PWM wave output circuit 20 outputs modulation waves PWM1 and PWM2 having different ON/OFF ratios.

The pulse width modulation output circuit of the first embodiment has the advantages described below.

(1) In the first embodiment, the dual PWM wave output circuit 20 receives the ramp voltages RMP21 and RMP22, the phases of which are shifted along a time axis at the same wave height. The ramp voltages RMP21 and RMP22 are used to output modulation waves PWM1 and PWM2 having different duties. This suppresses variations caused by the wave height of the ramp voltage or by a voltage shift. As a result, a wider dynamic range can be obtained when the voltage is lowered, and an accurate pulse width modulation wave can be output. Accordingly, sufficient swing can be obtained even in a low power supply voltage application.

(2) In the first embodiment, the shift amount of the ramp voltages RMP1 and RMP2 is controlled so that the voltages V21 and V22 include overlapping ranges. This outputs the modulation waves PWM1 and PWM2 having different duties. When shifted in the voltage direction, a comparator would perform a comparison with the inclination of a ramp voltage and convert the ramp voltage to a time signal. However, when performing shifting along a time axis as in the first embodiment, the ramp voltage is directly used as a time signal. This reduces error factors and increases the accuracy.

A pulse width modulation wave output circuit according to a second embodiment of the present invention will now be described with reference to FIGS. 3 and 4. The second embodiment uses multiplexers 33 and 34 in lieu of the OR circuit 23 and AND circuit 24 of the first embodiment. In the same manner as in the first embodiment, the second embodiment uses two ramp voltages of which phases are shifted from each other along a time axis.

Figure 3:
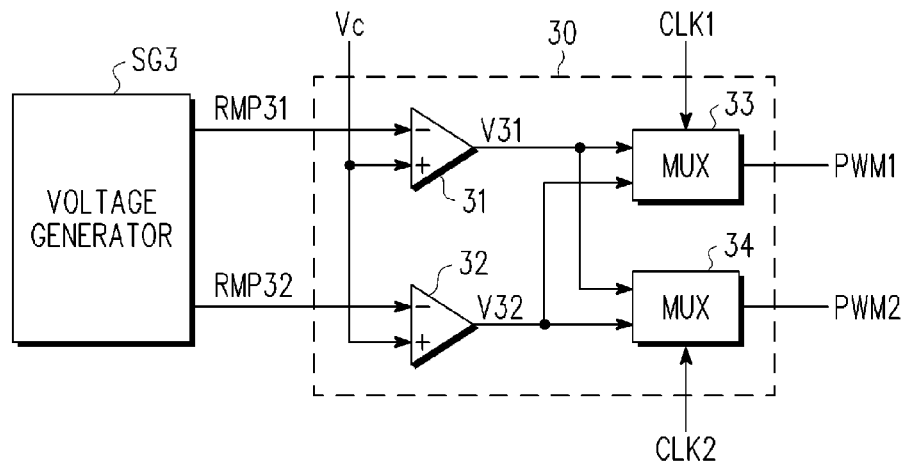
FIG. 3 is a circuit diagram of a pulse width modulation wave output circuit according to a second embodiment of the present invention.

Referring to FIG. 3, a dual PWM wave output circuit 30, which serves as the pulse width modulation wave output circuit of this embodiment, includes two comparators 31 and 32 and the two multiplexers 33 and 34. The comparator 31 serves as a first voltage comparison means, and the comparator 32 serves as a second voltage comparison means. The comparator 31 includes a negative input terminal, which receives a ramp voltage RMP31 from a voltage generator SG3, a positive input terminal, which receives a reference voltage Vc, and an output terminal, which outputs voltage V31. The comparator 32 includes a negative input terminal, which receives a ramp voltage RMP32 from the voltage generator SG3, a positive input terminal, which receives the reference voltage Vc, and an output terminal, which outputs voltage V32.

The multiplexers 33 and 34 respectively function as first and second signal selection means, each for selecting a predetermined input signal from a plurality of input signals in accordance with a clock signal.

The voltages V31 and V32 are input to the multiplexers 33 and 34. The multiplexer 34 receives a clock signal CLK1 (first clock signal), and the multiplexer 34 receives a clock signal CLK2 (second clock signal). The multiplexer 33 outputs a modulation wave PWM1, and the multiplexer 34 outputs, a modulation wave PWM2.

Figure 4A:
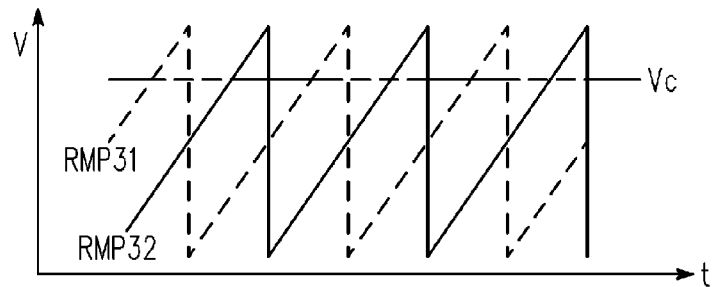
FIG. 4A is a timing chart of input ramp voltages.
Figure 4B:
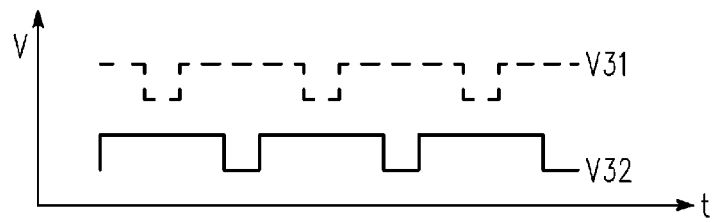
FIG. 4B is a timing chart of voltages output from comparators.

FIG. 4A shows the waveforms of the ramp voltages RMP31 and RMP32, which are generated by the voltage generator SG3 and input to the comparators 31 and 32. As shown in FIG. 4A, the ramp voltages RMP31 and RMP32 of the voltage generator SG3 have sawtooth waveforms. The ramp voltage RMP32 is generated by shifting the phase of the ramp voltage RMP31 by 180 degrees while maintaining the same wave height. In this case, the voltages V31 and V32 are output from the comparators 31 and 32 as rectangular waves of which phases are shifted from each other, as shown in FIG. 4B.

Figure 4C:
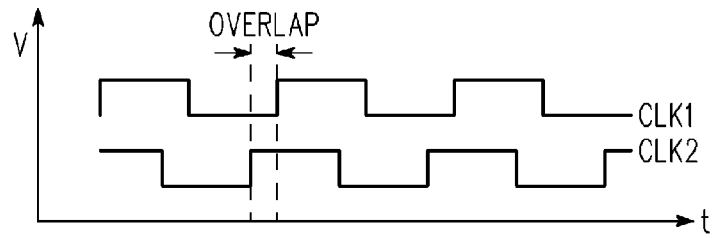
FIG. 4C is a timing chart of clock signals input to multiplexers.

Further, as shown in FIG. 4C, the clock signals CLK1 and CLK2, which are respectively input to the multiplexers 33 and 34, have the same clock frequency and are shifted from each other (phase-shifted) along a time axis. The clock signals CLK1 and CLK2 have overlapping ranges (overlapping ON periods) during which ON levels are overlapped.

Figure 4D:
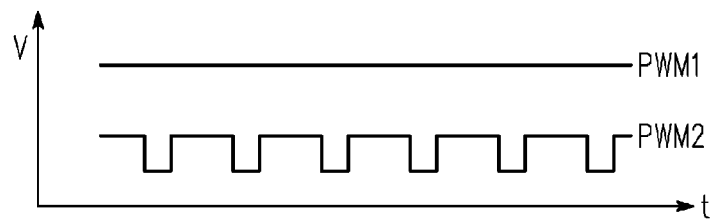
FIG. 4D is a timing chart of output PWM waves.

The multiplexer 33 selects the voltage V32 when the clock signal CLK1 has an ON level and selects the voltage V31 when the clock signal CLK2 has an OFF level. The multiplexer 34 selects the voltage V31 when the clock signal CLK2 has an ON level and selects the voltage V32 when the clock signal CLK2 has an OFF level. As a result, as shown in FIG. 4D, the multiplexers 33 and 34 output modulation waves PWM1 and PWM2 having different duties. The frequency of the modulation wave PWM2 may be increased by two times depending on the clock signal timing.

The pulse width modulation wave output circuit of the second embodiment has the advantage described below in addition to the advantage (1) of the first embodiment.

(3) In the second embodiment, the dual PWM wave output circuit 30 includes the two comparators 31 and 32 and the multiplexers 33 and 34, which synthesize a plurality of signals. The multiplexers 33 and 34 receive the clock signals CLK1 and CLK2, which have the same clock frequency and shifted phases. The clock signals CLK1 and CLK2 have the same clock cycle and overlapping ranges during which the ON levels are overlapped. The dual PWM wave output circuit 20 of the first embodiment overlaps pulse width modulation waves after comparing the two ramp voltages RMP21 and RMP22, which are shifted from each other along a time axis. Thus, due to the base point of the ramp voltages, the duty of the generated PWM wave differs for every other cycle. Further, a pulse width modulation wave is generated by using two different comparators 21 and 22. Thus, the pulse width modulation wave may be affected by the difference in offset between the comparators. In the second embodiment, overlapping ranges with respect to time are produced by the clock signals CLK1 and CLK2. This reduces variations in the overlapping amount.

A pulse width modulation wave output circuit according to a third embodiment of the present invention will now be described with reference to FIGS. 5 and 6. The third embodiment uses analog multiplexers 43 and 44 in lieu of the OR circuit 23 and AND circuit 24 of the first embodiment. In the same manner as in the first and second embodiments, the third embodiment uses two ramp voltages of which phases are shifted from each other along a time axis.

Figure 5:
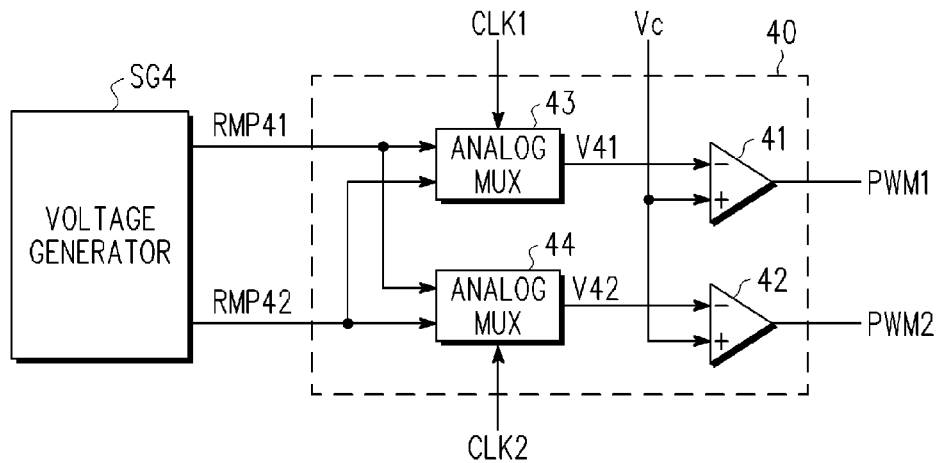
FIG. 5 is a circuit diagram of a pulse width modulation wave output circuit according to a third embodiment of the present invention.

Referring to FIG. 5, a dual PWM wave output circuit 40, which serves as the pulse width modulation wave output circuit of this embodiment, includes two comparators 41 and 42 and the two analog multiplexers 43 and 44. The comparator 41 serves as a first voltage comparison means, and the comparator 42 serves as a second voltage comparison means.

The analog multiplexers 43 and 44 respectively function as first and second analog signal selection means, each for selecting a predetermined signal from a plurality of input analog signals (third and fourth ramp voltages) in accordance with a clock signal. The analog multiplexers 43 and 44 receive ramp voltages RMP41 and RMP42 from a voltage generator SG4. Further, the analog multiplexer 43 receives a clock signal CLK1, and the analog multiplexer 44 receives a clock signal CLK2. The analog multiplexer 43 outputs voltage V41, and the analog multiplexer 44 outputs voltage V42.

The comparator 41 includes a negative input terminal, which receives the voltage V41, a positive input terminal, which receives a reference voltage Vc, and an output terminal, which outputs a modulation wave PWM1. The comparator 42 includes a negative input terminal, which receives the voltage V42, a positive input terminal, which receives the reference voltage Vc, and an output terminal, which outputs a modulation wave PWM2.

Figure 6A:
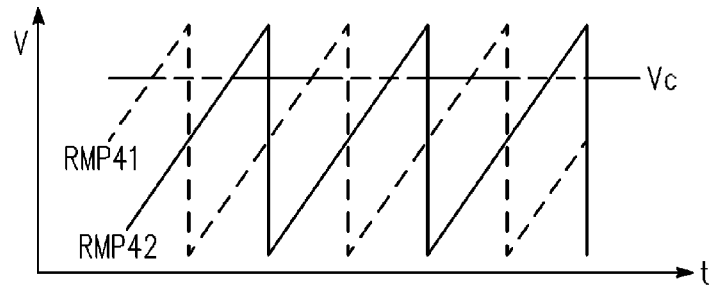
FIG. 6A is a timing chart of input ramp voltages.

FIG. 6A shows the waveforms of the ramp voltages RMP41 and RM242, which are generated by the voltage generator SG4 and input to the analog multiplexers 43 and 44. As shown in FIG. 6A, the ramp voltages RMP41 and RMP42 of the voltage generator SG4 have sawtooth waveforms. The ramp voltage RMP42 is generated by shifting the phase of the ramp voltage RMP41 by 180 degrees while maintaining the same wave height.

Figure 6B:
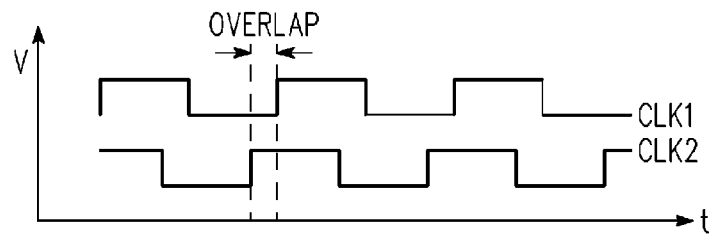
FIG. 6B is a timing chart of clock signals input to analog multiplexers.

Further, as shown in FIG. 6B, the clock signals CLK1 and CLK2, which are respectively input to the analog multiplexers 43 and 44, have the same clock frequency and shifted phases. Further, the clock signals CLK1 and CLK2 have overlapping ranges during which ON levels are overlapped.

Figure 6C:
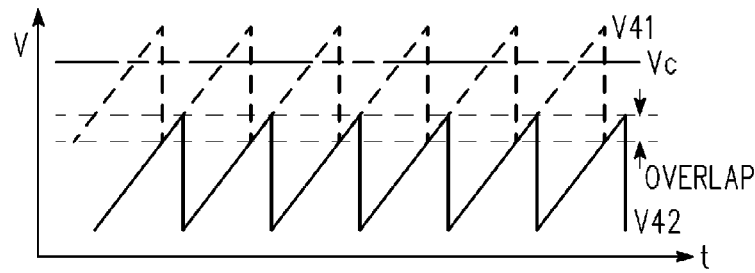
FIG. 6C is a timing chart of voltages output from comparators.

The analog multiplexer 43 selects the ramp voltage RMP42 when the clock signal CLK1 has an ON level and selects the ramp voltage RMP41 when the clock signal CLK1 has an OFF level. The analog multiplexer 44 selects the ramp voltage RMP41 when the clock signal CLK2 has an ON level and selects the ramp voltage RMP42 when the clock signal CLK2 has an OFF level. As a result, as shown in FIG. 6C, the multiplexers 43 and 44 output voltages V41 and V42 having shifted voltage levels and shifted phases.

Figure 6D:
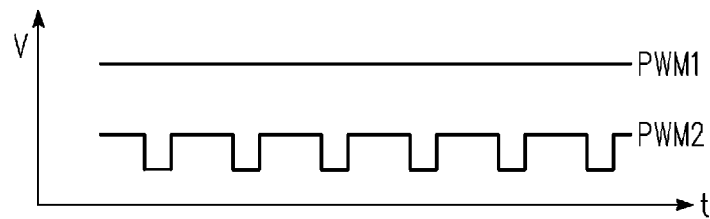
FIG. 6D is a timing chart of output PWM waves.
Figure 7:
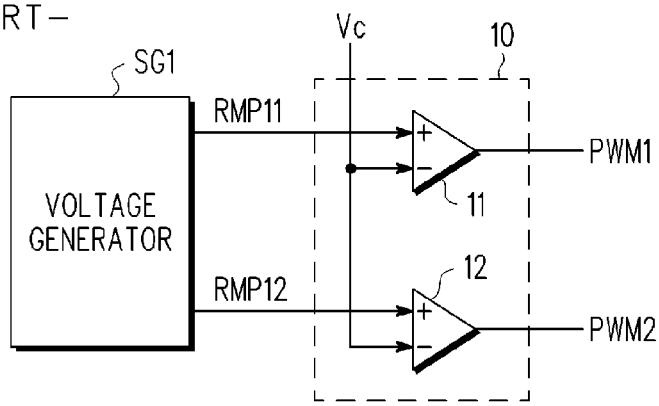
FIG. 7 is a circuit diagram of a pulse width modulation wave output circuit in the prior art.
Figure 8A:
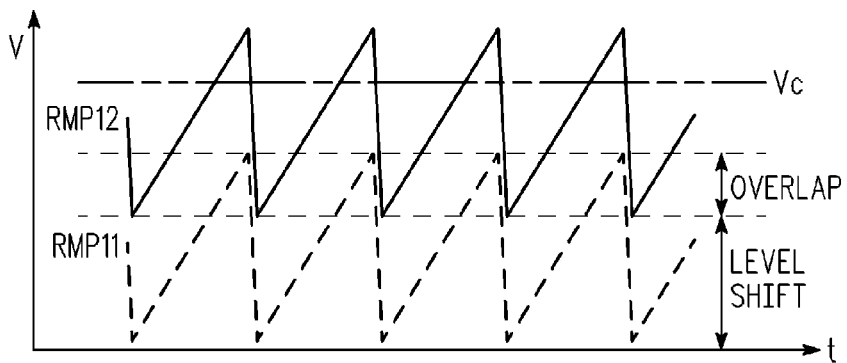
FIG. 8A is a timing chart of input ramp voltages.
Figure 8B:
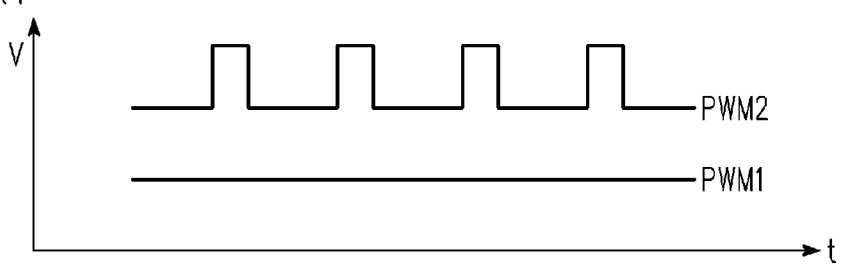
FIG. 8B is a timing chart of output PWM waves.
Figure 9:
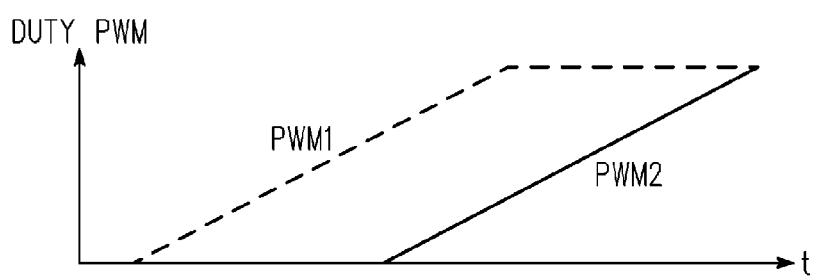
FIG. 9 is a chart showing the relationship between the reference voltage and duty in dual PWM waves.

The comparator 41, which receives the voltage V41, compares the voltage V41 and the reference voltage Vc to output the modulation wave PWM1. Further, the comparator 42, which receives the voltage V42, compares the voltage V42 and the reference voltage Vc to output the modulation wave PWM2. As a result, the dual PWM wave output circuit 30 outputs modulation waves PWM1 and PWM2 having different duties, as shown in FIG. 6D.

The pulse width modulation wave output circuit of the third embodiment has the advantage described below in addition to the advantage (1) of the first embodiment and advantage (3) of the second embodiment.

(4) In the third embodiment, the dual PWM wave output circuit 40 includes the two comparators 41 and 42 and the analog multiplexers 43 and 44, which select a signal from a plurality of signals in accordance with a clock signal. The arrangement of the analog multiplexers 43 and 44 in a stage preceding the two comparators of the prior art results in accurate and efficient output of dual PWM waves.

It should be apparent to those skilled in the art that the present invention may be embodied in many other specific forms without departing from the spirit or scope of the invention. Particularly, it should be understood that the present invention may be embodied in the following forms.

In the first embodiment, the dual PWM wave output circuit 20 compares the two ramp voltages RMP21 and RMP22, which are shifted from each other along a time axis, and then overlaps pulse width modulation waves. Thus, the duty of the generated modulation wave differs for every other cycle due to the base point of the ramp voltages. In this case, the phase difference between the ramp voltages RMP21 and RMP22 may be set to 180 degrees so that the modulation waves PWM1 and PWM2 can be output with uniform cycles.

In the second and third embodiments, the phases of the two ramp voltages RMP input to the dual PWM wave output circuit are shifted from each other by 180 degrees. However, the phase difference of the ramp voltages is not limited to 180 degrees.

In each of the above embodiments, the reference voltage Vc is input to the positive input terminal of the comparator 22 in the dual PWM wave output circuits 20, 30, and 40. However, the reference voltage Vc may be input to the negative input terminal.

The present examples and embodiments are to be considered as illustrative and not restrictive, and the invention is not to be limited to the details given herein, but may be modified within the scope and equivalence of the appended claims.

What is claimed is:

1. A pulse width modulation wave output circuit comprising:

a first voltage comparison means for receiving a first ramp voltage at a negative input terminal of the first voltage comparison means;

a second voltage comparison means for receiving a second ramp voltage at a negative input terminal of the second voltage comparison means, the second ramp voltage having a phase shifted from that of the first ramp voltage;

wherein the first and second voltage comparison means receive a reference voltage at positive input terminals thereof and perform comparison with the reference voltage to output first and second comparison signals used to generate first and second pulse width modulation signals;

an OR gate that receives the first and second comparison signals and generates the first pulse width modulation signal; and an AND gate that receives the first and second comparison signals and generates the second pulse width modulation signal, wherein the first and second pulse width modulation signals have different ON/OFF duty cycles.

2. The pulse width modulation wave output circuit according to claim 1, wherein the first and second ramp voltages have sawtooth waveforms.

* * * * *